US006841987B2

(12) United States Patent
Clegg et al.

(10) Patent No.: US 6,841,987 B2
(45) Date of Patent: Jan. 11, 2005

(54) HIGH SPEED MEASUREMENT SYSTEM WHICH SELECTS OPTIMAL MEASUREMENT RANGE ON A SAMPLE BY SAMPLE BASIS

(75) Inventors: Russell A. Clegg, Hibernia, NJ (US); James R. Medunick, Newton, NJ (US)

(73) Assignee: Agilent Technologies, Inc., Palo Alto, CA (US)

( * ) Notice: Subject to any disclaimer, the term of this patent is extended or adjusted under 35 U.S.C. 154(b) by 192 days.

(21) Appl. No.: 10/173,866

(22) Filed: Jun. 19, 2002

(65) Prior Publication Data

US 2003/0234642 A1 Dec. 25, 2003

(51) Int. Cl.[7] ............................................. G01R 15/08
(52) U.S. Cl. .................................... 324/115; 324/158.1
(58) Field of Search ............................. 324/115, 123 C, 324/523, 509, 512, 522, 119, 95, 158.1; 714/719, 720, 724; 341/131, 118

(56) References Cited

U.S. PATENT DOCUMENTS 5,493,298 A * 2/1996 Bartz ......................... 341/131
5,583,417 A * 12/1996 Yuen ........................... 320/22

* cited by examiner

Primary Examiner—Kamand Cuneo
Assistant Examiner—Jimmy Nguyen

(57) ABSTRACT

A high speed multiple range measurement system that selects on a sample by sample basis the range having the highest resolution and accuracy for which an overload condition does not exist. A plurality of analog to digital converters sample and convert an analog of a physical quantity, such as voltage, current, temperature, strain etc. to a plurality of digital data steams, each having a full scale range representing a fraction of an expected maximum value of the physical quantity. Corresponding overload detectors test the respective data streams for an overload condition. A data selector chooses the data stream having a full scale representing the smallest fraction of an expected maximum value based on the overload detector status.

42 Claims, 11 Drawing Sheets

HIGH SPEED MEASUREMENT SYSTEM WHICH SELECTS OPTIMAL MEASUREMENT RANGE ON A SAMPLE BY SAMPLE BASIS

BACKGROUND OF THE INVENTION

1. Field of the Invention

The present invention is directed to a measuring system for physical parameters, such as for example, electrical current, voltage, temperature, strain, etc., and more particularly, to a measurement system which simultaneously makes a plurality of high speed measurements at different measurement sensitivities or ranges and outputs an optimal one of the measurements on a sample by sample basis.

2. Description of the Related Art

FIG. 1 is a block diagram of a conventional measuring system for measuring electrical current. In the current measuring system of FIG. 1, multiple current shunts RH and RL and amplifiers A1 and A2 are used to cover a dynamic range of a signal to be measured. In operation, one of the shunts RH or RL is selected by switches SH and SL. The amplifiers A1 and A2 are powered from power sources V1 and V2.

An output of amplifier A1 provides a low range measurement, ImonL, to an input 0 of a multiplexer 101 and an output of amplifier A2 provides a high range measurement, ImonH, to an input 1 of the multiplexer 101. A capacitor CL is connected in parallel with the resistor RL and provides damping during operation of the switches SL and SH. An output (Out) of the multiplexer 101 is provided as an input to an analog to digital (AND) converter 102. The A/D converter 102 provides a digitized output signal which is input to a logic gate array 103. The logic gate array 103 provides a control to the multiplexer 101 to select one of the input 0 and the input 1 of the multiplexer 101.

The current measurement system of FIG. 1 is inserted in a circuit to be measured so that a current I1 flows between in and Return as shown in FIG. 1. The current measurement system of FIG. 1 allows for a wide dynamic measurement range, high resolution and high accuracy measurements. However, measurements are not possible while the system is changing ranges and range changing is slow. Further, during a range change, the current I1 is disturbed. Therefore, the system must wait for the signal to settle before a measurement is taken. In a similar system (not shown), shunt resistors RL and RH are series connected and RL Is bypassed to make high range measurements. The series connected system has problems similar to the problems of the parallel shunt system shown in FIG. 1.

In another conventional current measurement system, a single shunt and multiple measurement amplifiers are employed as shown in FIG. 2. The single shunt measuring system of FIG. 2 is inserted in a circuit to be measured so that a current I1 flows between in and Return as shown in FIG. 2 and the current I1 flows through a resistor RM which is commonly connected with respective inputs of measurement amplifiers A3 and A4. The measurement amplifier A3 is a high gain amplifier and provides an output ImonL to the input 0 of the multiplexer 101. The measurement amplifier A4 is a low gain amplifier and provides an output ImonH to the input 1 of the multiplexer 101. The multiplexer 101, the A/D converter 102 and the logic gate array 103 operate in a similar manner as described with reference to FIG. 1.

In the measurement system shown in FIG. 2, as I1 increases, the high gain measurement amplifier A3 saturates and the system must smoothly transition to utilize feedback of the low gain amplifier A4. The measurement system of FIG. 2 allows for a smaller settling time when switching from a higher measurement range to a lower measurement range. However, the system of FIG. 2 does not provide continuous current measurements due to the saturation of the lower range measurements which are made by the high gain measurement amplifier A3. In addition, the system of FIG. 2 has an inherent disadvantage of providing poor resolution and accuracy of the measured signal at low current levels as the shunt RM must be sized to handle the entire dynamic range.

SUMMARY OF THE INVENTION

The present invention provides a high-speed measurement system which provides a wide dynamic range, high accuracy, and high resolution and allows for continuous measurements to be taken. Preferably, the invention is implemented with high density gate arrays. Alternatively, the invention may also be implemented in discrete logic or software.

The present invention provides a system which simultaneously considers a plurality of digital inputs which represent contemporaneous measurements of the same physical quantity, such as for example, electrical voltage, current, strain, temperature, etc. Each of the plurality of digital inputs has a measurement scale factor which differs from a measurement scale factor of the other inputs. The scale factors range from a most sensitive input to a least sensitive input. A plurality of overload detectors having a one to one correspondence with the plurality of digital inputs simultaneously detect whether an overload condition exists for each sample cycle. A logic circuit determines whether to output one of the digital inputs, or to output an arbitrary digital value if appropriate overload conditions exist.

Each of the overload detectors compares the respective digital input with a predetermined value and latches an overload bit if the overload condition is found for the respective digital input. A data selector outputs digital data corresponding to the digital input having the highest scale factor for which an overload condition does not exist. Each overload detector comprises a post overload counter which holds the overload bit in a latched condition for a predetermined time after an overload condition ceases to be detected, to ensure that a measurement channel corresponding to the respective digital input is out of saturation and completely settled.

The plurality of digital inputs are preferably provided by a plurality of analog to digital converters which sample the physical quantity and the overload detectors determine whether the respective overload conditions exist for each sample of each analog to digital converter and the data selector selects the digital data stream having the highest measurement scale factor for which an overload condition does not exist on a sample by sample basis.

BRIEF DESCRIPTION OF THE DRAWINGS

The present invention will become more apparent and more readily appreciated from the following description of the various embodiments, taken in conjunction with the accompanying drawings in which.

DETAILED DESCRIPTION OF THE INVENTION

Figure 1:
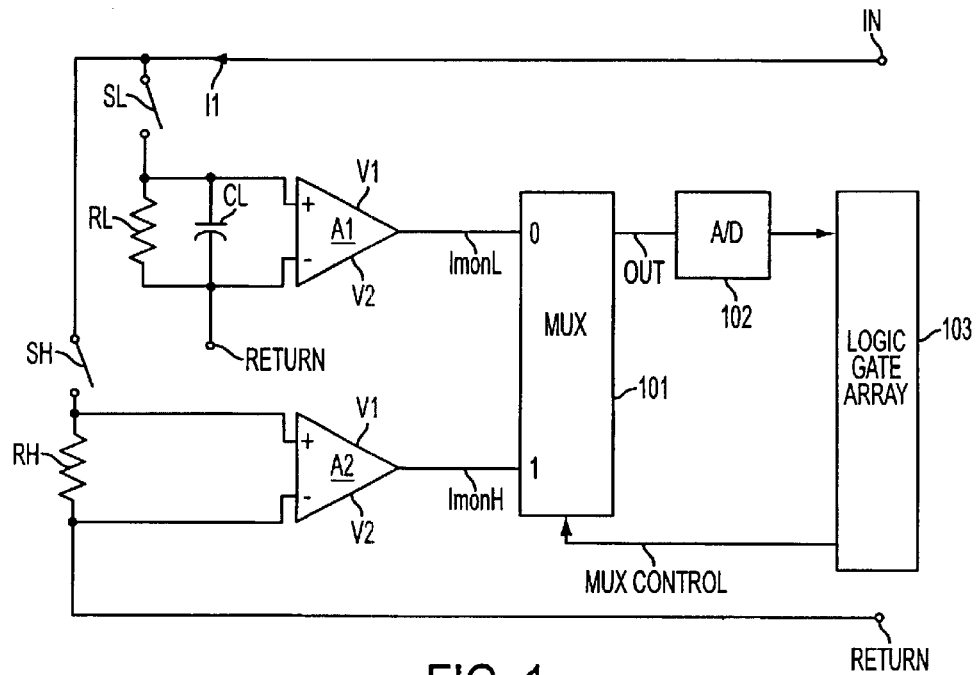
FIG. 1 is a block diagram of a conventional multi-range measurement system.
Figure 2:
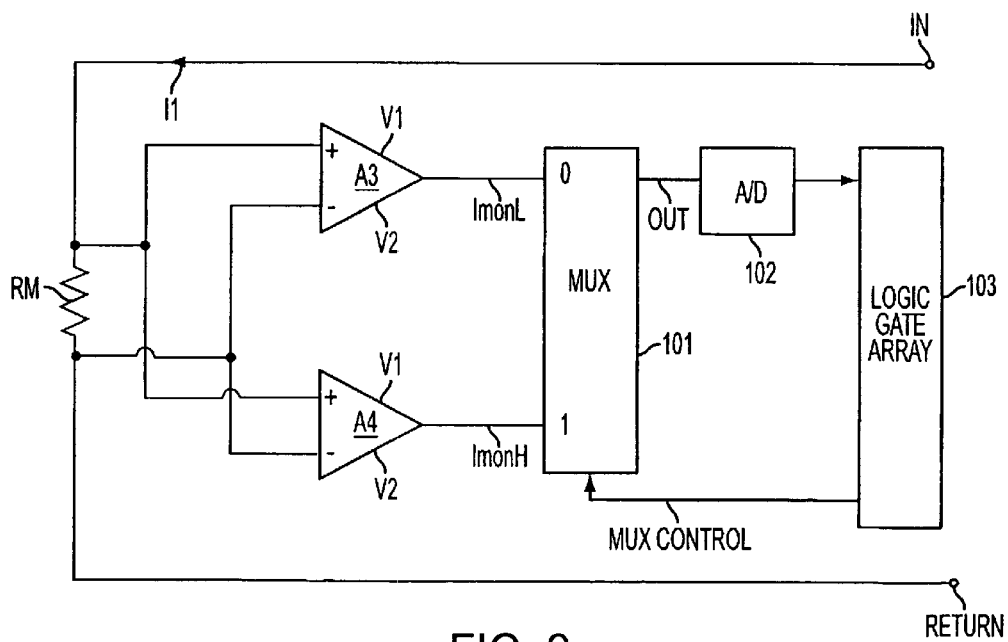
FIG. 2 is a block diagram of another conventional multi-range measurement system.

Reference will now be made in detail to the embodiments of the present invention, examples of which are illustrated in the accompanying drawings, wherein like reference numerals refer to like elements throughout.

Figure 3:
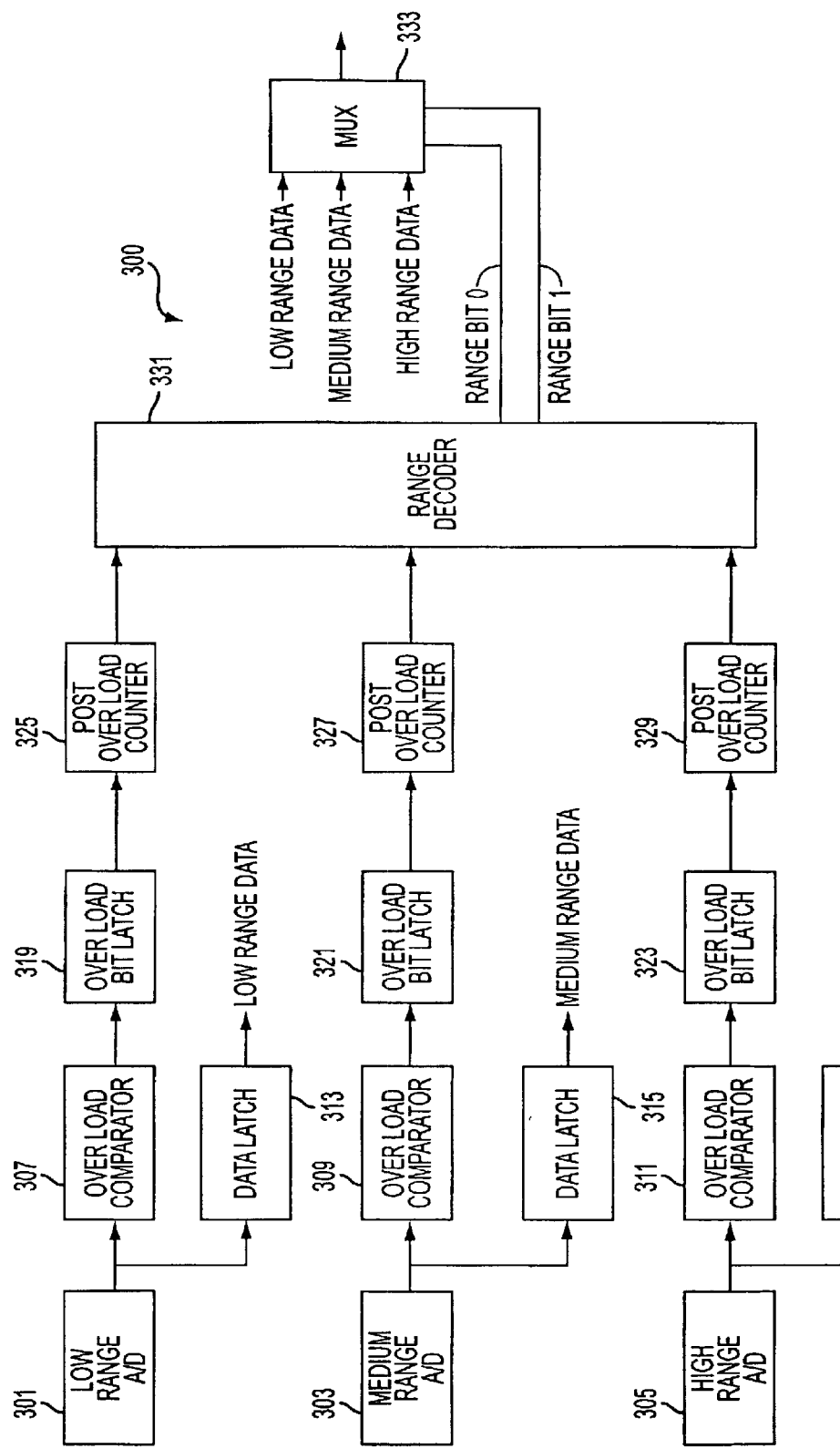
FIG. 3 is a block diagram of a first embodiment of a measurement system according to the present invention.

Referring now to FIG. 3, a first embodiment of a general measurement system according to the present invention is illustrated as a three range measurement system 300. The measuring system 300 comprises: low, medium and high range analog to digital (A/D) converters 301, 303 and 305, respectively; low, medium and high range overload comparators 307, 309 and 311, respectively; low, medium and high range data latches 313, 315 and 317, respectively; low, medium and high overload bit latches 319, 321 and 323, respectively; low, medium and high post overload counters 325, 327 and 329, respectively; a range decoder 331 and a multiplexer (Mux) 333.

For each of low, medium and high measurement ranges, a corresponding analog transducer device (not shown) converts a physical parameter, such as for example, electrical current, electrical voltage, temperature, strain, pressure, etc., into an analog quantity. The low, medium and high range analog to digital converters 301, 303 and 305, respectively, convert the respective analog quantities into respective digital words. For each of the low, medium and high ranges, the digital words from the A/D converters 301, 303 and 305, respectively, are compared to respective overload set points by corresponding overload comparators 307, 309 and 311. Based on the respective comparisons, the system 300 determines whether one or more of the AND converters 301, 303 and 305 is/are overloaded. An overload status is latched by the overload bit latches 319, 321 and 323 and the corresponding digital word is latched by the data latches 313, 315 and 317, respectively, to provide Low Range Data, Medium Range Data and High Range Data, respectively.

The range decoder 331 decodes the overload status as indicated by the overload bit latches 319, 321 and 323 ranges into a range word consisting of two bits labeled Range Bit 0 and a Range Bit 1. The range word is used by the multiplexer 333 to select data from the lowest non-saturated range available. That is, the Multiplexer 333 selects one of the Low Range Data, the Medium Range Data and the High Range Data based on a logical combination of the range word. The selecting of the lowest non-saturated range assures that the system 300 selects the optimal available range to maximize accuracy and resolution for each individual reading. The selected data is clocked out for use by a larger system (not shown) which incorporates the measurement system 300.

The measurement system 300 comprises post overload counters 325, 327 and 329. Where a measurement range has been overloaded and the range comes out of the overloaded state, a post overload counter is started. The post overload counter counts to a preprogrammed value analogous to a settling time of the range with which the counter is associated. If, during the counting process, the range overloads again, the counter is reset and the counting starts again from a predetermined initial set point after the overload condition is removed. If the counter successfully reaches the preprogrammed value without being reset, the associated overload bit latch 319, 321 or 323 is reset and the range is again available for use.

Figure 4:
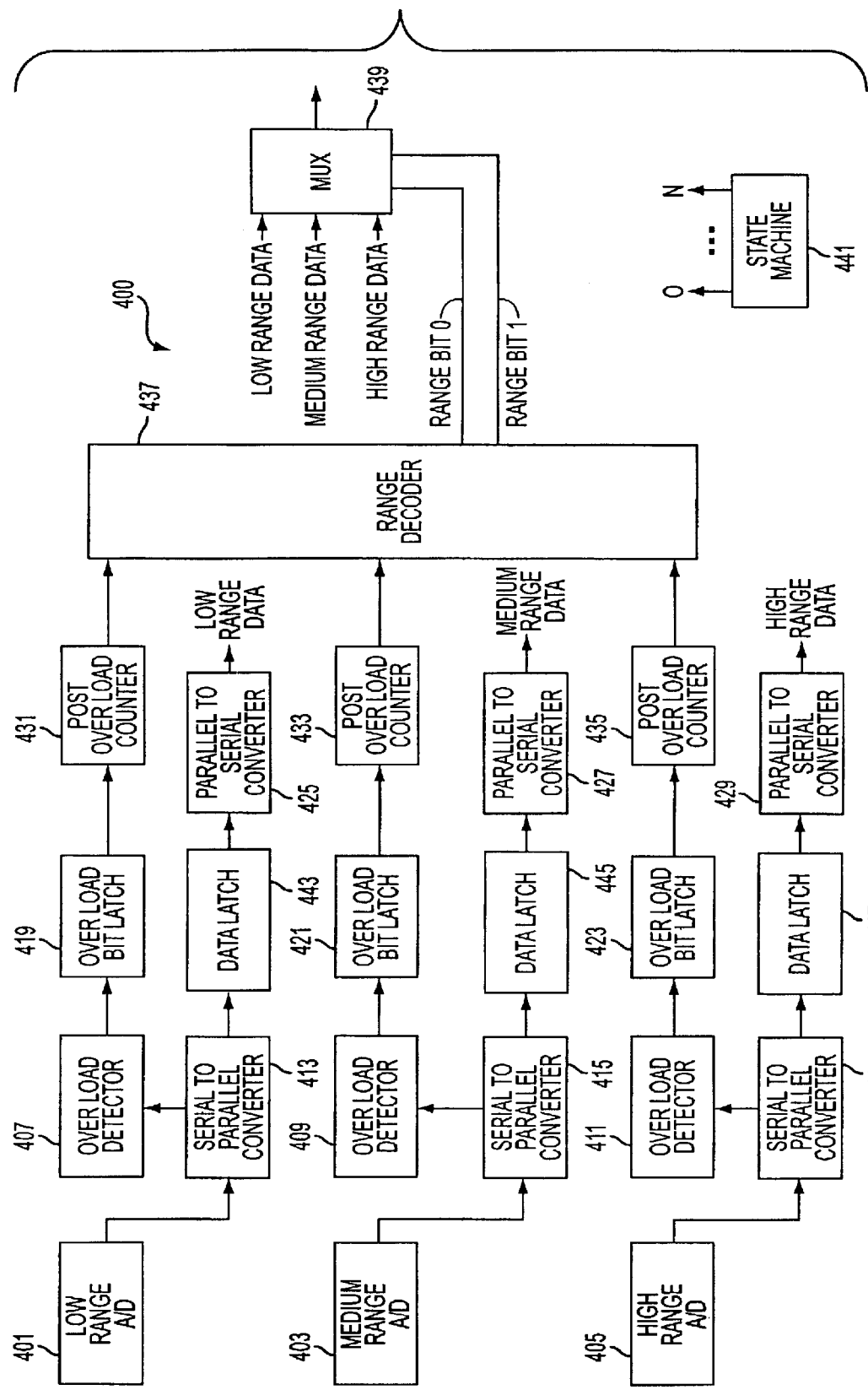
FIG. 4 is a block diagram of a second embodiment of a measurement system according to the present invention.

Referring now to FIG. 4, a second embodiment of a measurement system according to the present invention is illustrated as a three range measurement system 400.

The measurement system 400 comprises: low, medium and high range analog to digital (A/D) converters 401, 403 and 405, respectively; low, medium and high range overload detectors 407, 409 and 411, respectively; low, medium and high range serial to parallel converters 413, 415 and 417; low, medium and high range data latches 443, 445 and 447, respectively; low, medium and high overload bit latches 419, 421 and 423, respectively; low, medium and high parallel to serial converters 425, 427 and 429, respectively; low, medium and high post overload counters 431, 433 and 435, respectively; a range decoder 437; a multiplexer (MUX) 439; and a state machine 441.

The state machine 441 provides overall synchronization control for the measuring system 400 and for a larger system (not shown) which incorporates the measuring system 400. Synchronous operation is accomplished by the state machine 441 outputting N possible states in repetitive cycles to trigger key events. The state machine may be implemented, for example, by shifting one bit through an N-bit wide register and outputting all of the N possible states. In the description below and/or in the accompanying drawings, a notation, for example, State 16 indicates that an input corresponding to State 16 of the state machine is being provided to a particular circuit while a notation, for example, State [34:0. indicates that an inclusive range of states is being provided to a particular circuit or group of circuits.

Referring again to FIG. 4, for each of low, medium and high ranges, a corresponding analog transducer device (not shown) converts a physical parameter, such as for example, electrical current, electrical voltage, temperature, strain, pressure, etc., into an analog quantity and provides the respective analog quantity to the low, medium and high range analog to digital converters 401, 403 and 405, respectively, which convert the respective analog quantities into respective digital words. The serial to parallel converters 413, 415 and 417 latch the data synchronized with the state machine 441. The serial to parallel converters 413, 415 and 417 may be implemented as shift registers. Conversion of serial data to parallel data is required to test each analog conversion for an overload condition by the low, medium and high range overload detectors 407, 409 and 411, respectively. If an overload condition is found, at least one of the low range, the medium range and the high range overload bit latches 419, 421 and 423, respectively latches an output indicating the overload. That is, if the low range is overloaded, the bit latch 419 latches an output indicating the overload. If the low and medium ranges are both overloaded, the bit latches 419 and 421 both latch respective outputs indicating the respective overloads. If the low, medium and high ranges are overloaded, the overload bit latches 419, 421 and 423 all latch an output indicating the respective overloads.

Meanwhile, the data latched by the low range, medium range and high range data latches 443, 445 and 447, respectively are converted synchronously with the state machine by the parallel to serial converters 425, 427 and 429, respectively, to output Low Range Data (DOL), Medium Range Data (DOM) and High Range Data (DOH), respectively.

Respective outputs of the overldoad bit latches 419, 421 and 423 are provided to post overload counters 431, 433 and 435, respectively. Where a measurement range has been overloaded and the range comes out of the overloaded state, the corresponding post overload counter (431, 433, 435) is started. The post overload counter counts toward a preprogrammed value based on a settling time of the range with which the counter is associated. If, during the counting process, the range overloads again, the counter is reset to the initial value and the counting starts again toward the preprogrammed value once the overload condition is removed. If the counter successfully reaches the preprogrammed value without being reset, the associated overload bit latch 419, 421, or 423 is reset and the range is again available for use. The post overload counter latches an output which remains latched until the overload condition is removed and the counter has reached the preprogrammed value. The latched outputs of post overload counters 431, 433 and 435 are provided as inputs to the range decoder 437.

The range decoder 437 decodes the overload status as indicated by the outputs of the post overload counters 431, 433 and 435 to output the range word comprising the Range Bit 0 and the Range Bit 1. The range word is used by the multiplexer 439 to select data from the lowest non-saturated range available. That is, the multiplexer 439 selects one of the Low Range Data (DOL), the Medium Range Data (DOM) and the High Range Data (DOL) based on a logical combination of the bits of the range word. The selecting of the lowest non-saturated range assures that the system 400 selects the optimal available range to maximize accuracy and resolution for each individual reading. The selected data is clocked out for use by the larger system (not shown) which incorporates the measurement system 400.

Figure 5:
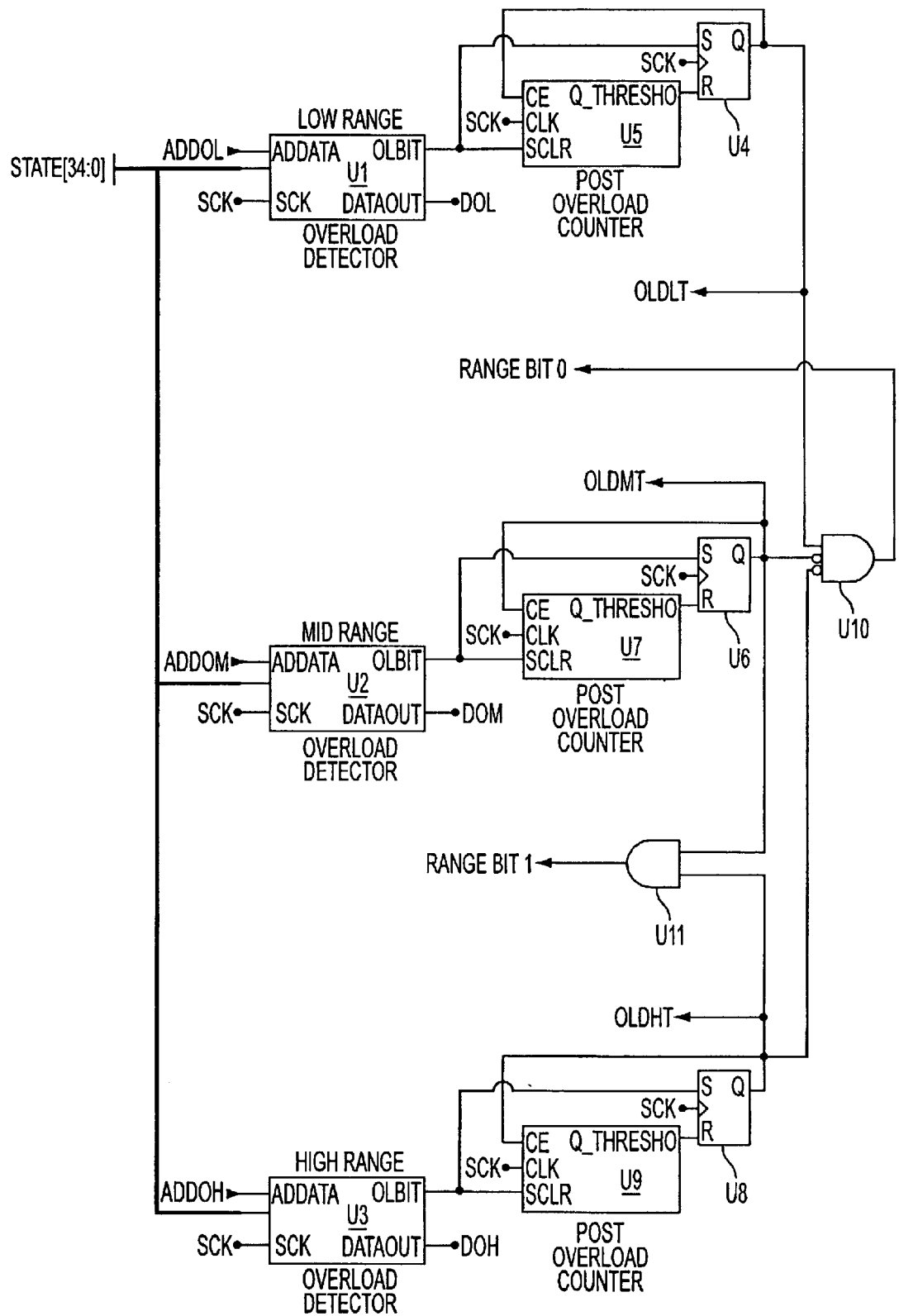
FIG. 5 is a more detailed diagram of a portion of the block diagram shown in FIG. 4.
Figure 6:
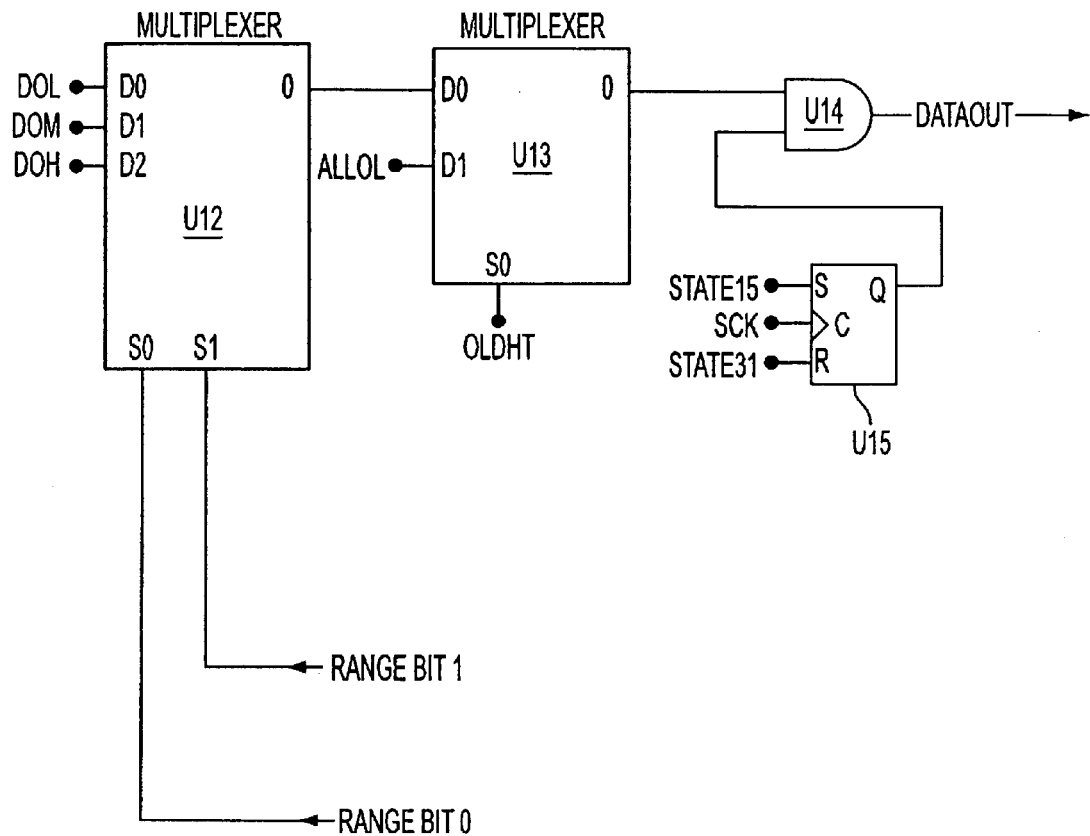
FIG. 6 is a more detailed diagram of the multiplexer shown in FIG. 4.
Figure 7:
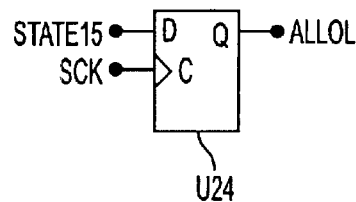
FIG. 7 is a diagram of a data word generator to generate the ALLOL data word indicated in FIG. 6.

A more detailed description of the system shown in FIG. 4 will now be described with reference to FIGS. 5, 6 and 7. Referring now to FIG. 5, the measuring system 400 comprises a low range overload detector U1, a mid range overload detector U2 and a high range overload detector U3. The overload detectors U1, U2 and U3 are similarly constructed and operated. The construction and operation of the overload detectors U1, U2 and U3 will be explained with reference to the low range overload detector U1 to avoid a redundancy which does not contribute to the explanation of the invention.

Figure 8A:
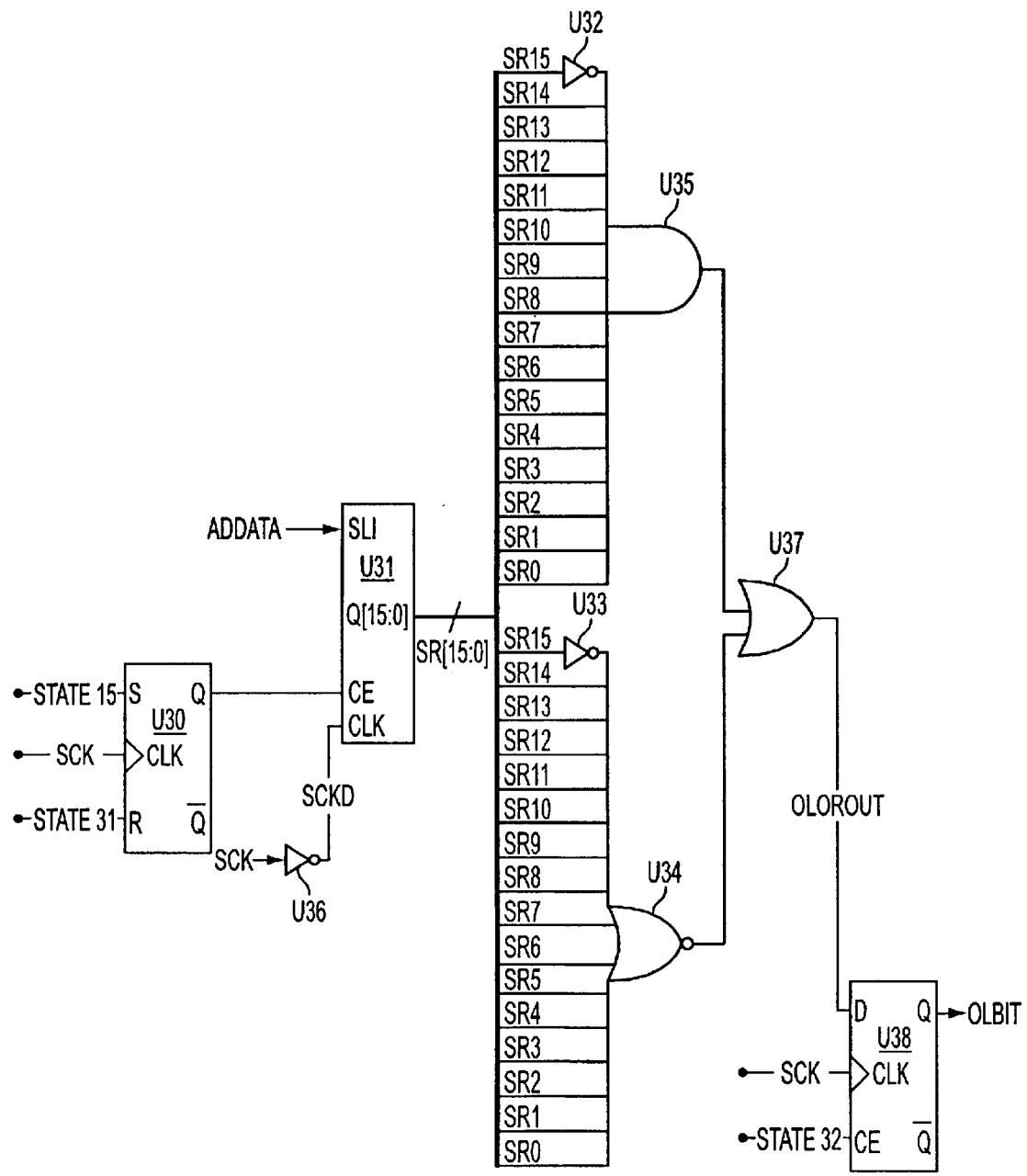
FIGS. 8A, 8B and 8C together form a schematic diagram of the overload detector blocks U1, U2 and U3 shown in FIG. 5.
Figure 8B:
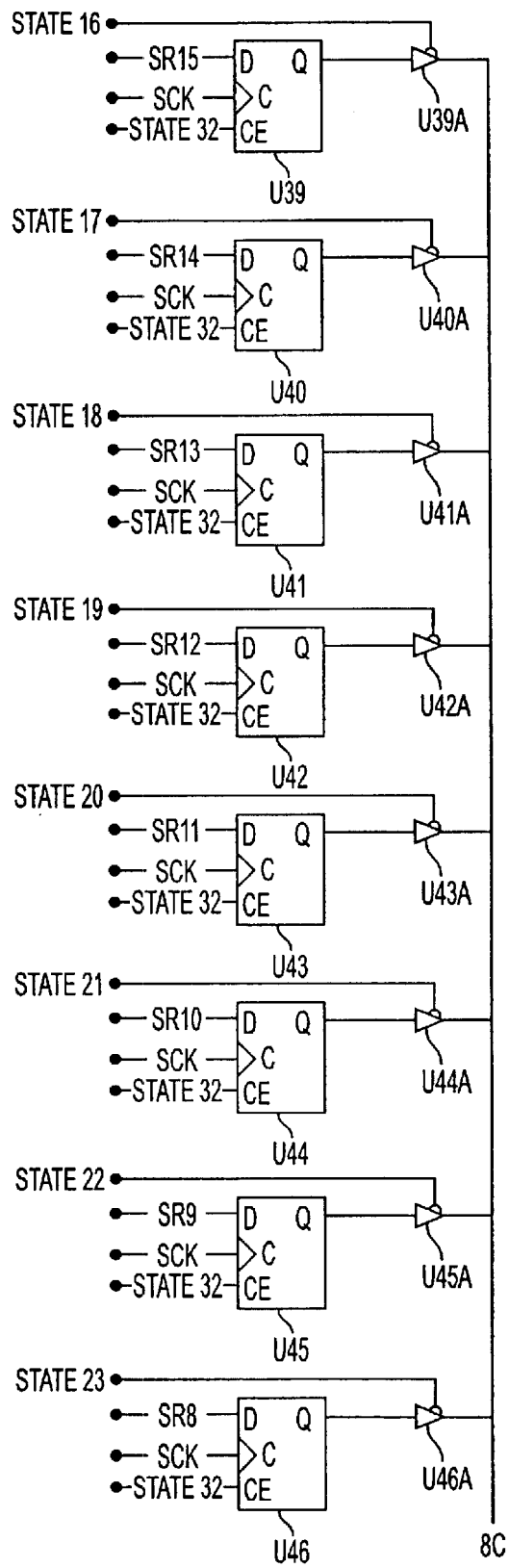
Figure 8C:
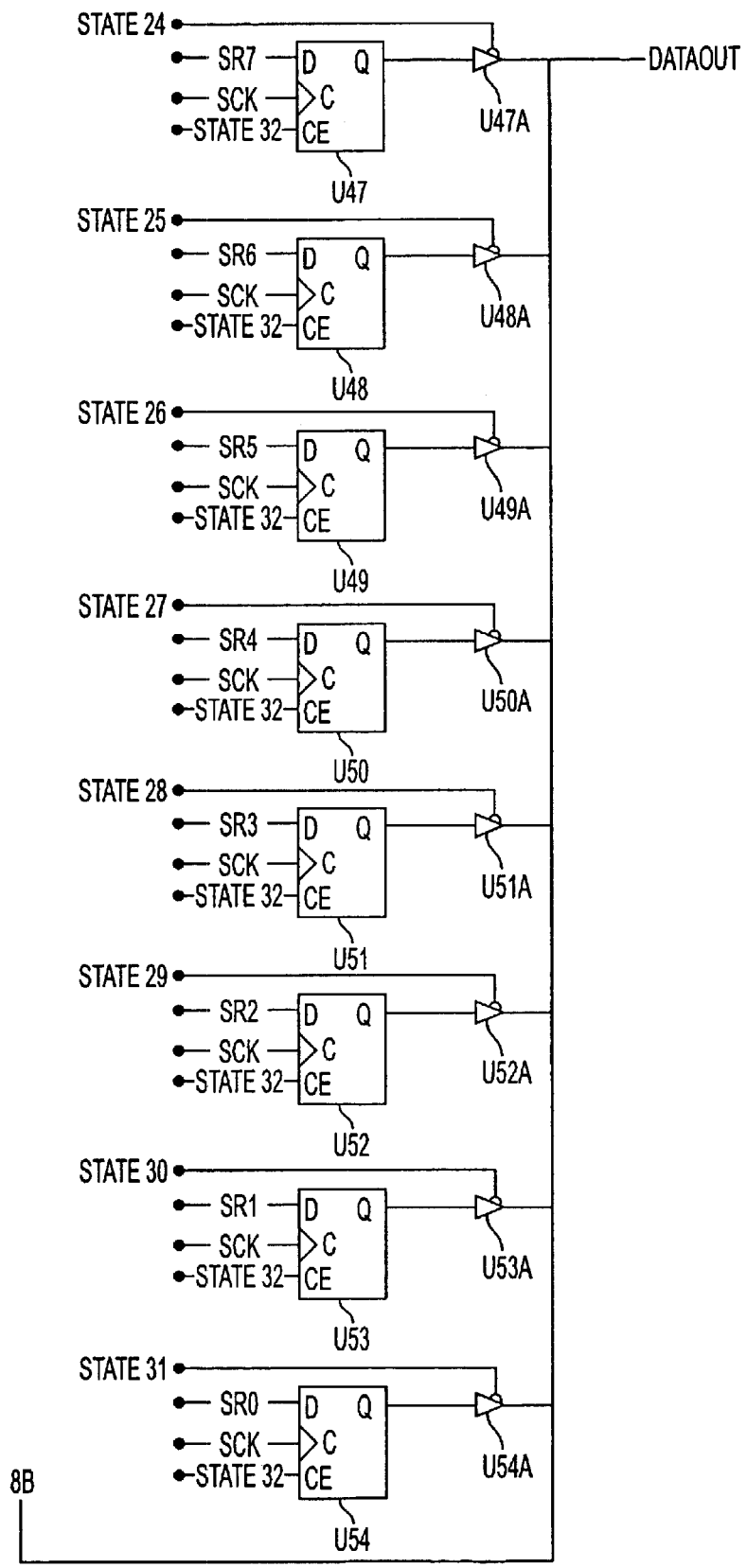

Referring now to FIGS. 8A, 8B and 8C, a schematic diagram of the low range detector U1 is shown. Timing for the detection block U1 is synchronously provided by the state machine 441 described above.

Figure 9:
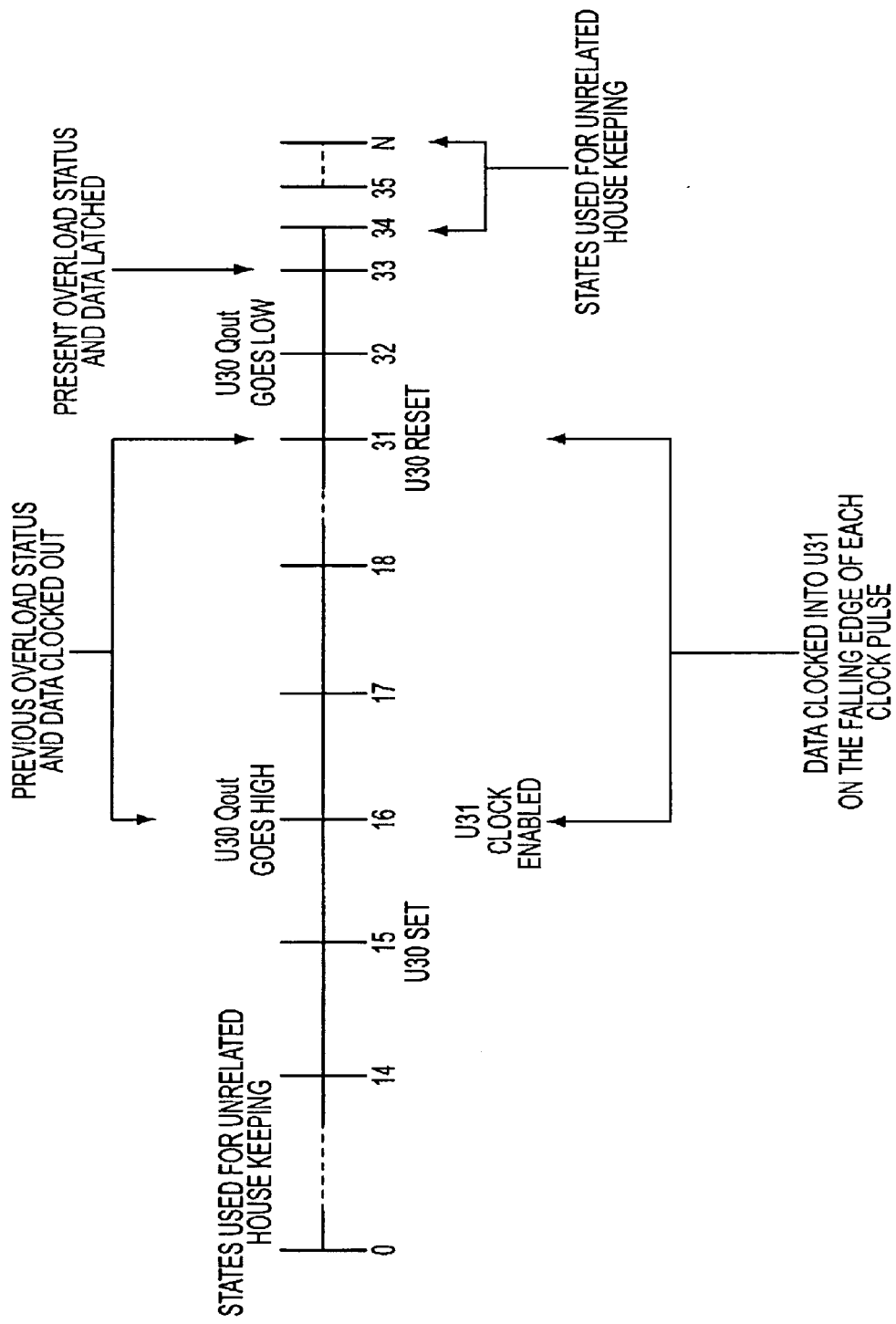
FIG. 9 is a timing diagram of the measurement system shown in FIG. 4.

Referring now to FIG. 8A and also to FIG. 9, in operation, data (ADDATA) from the Low Range A/D converter 401 (FIG. 4) is clocked into an SLI input (FIG. 8A) of a 16 bit serial to parallel shift register U31 by a system clock SCK. An SR flip flop U30 is set on State 15. Synchronous with State 16, the output Q of the SR flip flop U30 goes high and at State 16 the clock of shift register U31 is enabled, allowing the shift register U31 to shift the data ADDATA into U31 at the same time the data ADDATA is available from the A/D converter 401. The serial to parallel converters 413, 415 and 417, shown in FIG. 4, each comprise a flip flop U30, a shift register U31 and an inverter U36.

As the data bits are shifted into the shift register U31, the contents of a previous reading are shifted out of the shift register U31. The contents SR [15:0] of the shift register U31 are provided to a NOR gate U34 to detect a low overload set point and to an AND gate U35 to detect a high overload set point. The most significant bit (MSB) of SR [15:0] is inverted by inverters U31 and U32 prior to providing the contents of the shift register U31 to the NOR gate U34 and the AND gate U35.

In the embodiment shown in FIG. 8A, a hex value of 7FFF (positive full scale) is the high overload set point and a hex value of 8000 (negative full scale) is the low overload set point. If the value of SR [15:0] having the inverted MSB is equal to the high overload set point, the output of the AND gate U35 becomes high and if the value of SR [15:0] having the inverted MSB is equal to the low overload set point, the output of NOR gate U34 becomes high. Thus, if either the output of the NOR gate U34 is high or the output of the AND gate U35 is high, the output of the OR gate U37 is high. The output of the OR gate U37 is indicated as an overload condition OLOROUT. Each of the overload detectors 407, 409 and 411 comprise inverters U32 and U33, a NOR GATE U34, an AND gate U35 and an OR gate U37. The overload condition OLOROUT is latched on State 33, by the flip-flop U38 to provide the signal OLBIT. Each overload bit latch 419, 421 and 423 comprises a flip flop U38. Selection of an overload set point as used in the embodiment shown in FIG. 8A is completely arbitrary and those skilled in the art will understand how to use the appropriate combinational logic circuit subsequent to the shift register U31 to achieve any desired set point. In addition, the high overload set point and the low overload set point need not be symmetrical in nature.

Referring now to FIGS. 8B and 8C, individual bits of the digital word SR[15:0] from the shift register U31 are provided as inputs to flip-flops U39 through U54 and at State 33, the respective bits of the digital word are latched by flip-flops U39 through U54. Each data latch 443, 445 and 447 shown in FIG. 4 comprises flip flops U39 through U54. It is important to note that the latching occurs a State 33 which is after the time that the shift register U31 has completed clocking in ADDATA.

The respective outputs from flip-flops U39 through U54 are bused together through a series of tri-state buffers U39A through U54A, respectively, each of which is triggered in sequence synchronous with States 16 through 31 of the next A/D conversion of the A/D converter 401. Thus, a conversion delay of one cycle of the state machine exists between a time that the data from the A/D converter 401 is collected and a time that the data from the A/D converter is acted on by the measurement system 400. This delay allows a determination of an overload condition. The tri-state buffers U39A through U54A output the data DOL. Each parallel to serial converter 425, 427 and 429 shown in FIG. 4 comprises tristate buffers U39A through U54A.

Referring again to FIG. 5, the mid range overload detector U2 and the high range overload detector U3 are similarly constructed as the low range detector U1 shown in detail in FIGS. 8A, 8B and 8C with each of overload detectors U2 and U3 also having an associated overload status bit OLBIT indicating an overload status of the corresponding range. Also, the mid range overload detector U2 outputs data DOM and the high range overload detector U3 outputs data DOH.

Considering again the low range and referring again to FIG. 5, if the overload bit OLBIT goes high indicating an overload condition is present, flip flop U4 is set and output Q of the flip flop U4 goes high. The output Q of the flip-flop U4 is applied to the clock enable CE of the a post overload counter U5 to enable the clock CLK of the post overload counter U5. Upon clearing of the overload condition, OLBIT goes law, allowing the post overload counter U5 will begin to count from an initial value to a predetermined value. The predetermined value corresponds to a time required for analog measurement hardware (not shown) which provides the input to the A/D converter 401 to settle after an overload condition has been removed. If the overload condition returns before the post overload counter U5 has reached the predetermined value, the post overload counter U5 is reset and counting begins again from the initial value upon clearing of the overload condition. After the post overload counter U5 has successfully reached the predetermined value, an output Q_THRESHO of the post overload counter U5 will go high, resetting the flip-flop U4, causing the output Q of flip-flop U4 to go low, which in turn disables the counter U5.

A mid range post overload counter U7 and an associated flip-flop U6 and a high range post overload counter U9 and an associated flip-flop U8 are similarly constructed and operate similarly as the low post overload counter U5 and the associated flip flop U4, each latching an associated overload status bit OLBIT.

Referring again to FIG. 5, the output Q of flip-flop U6 and the output Q of flip-flop U8 are provided to a two input AND gate U11. A range bit, RANGEBIT 1, is thus determined by the output Q of the flip-flop U6, the output Q of the flip-flop U8 and the AND gate U11.

The output Q of flip-flop U4, the output Q of flip-flop U6 and the output Q of the flip-flop U8 are provided to a three input AND gate U11, with the output Q of the flip-flop U6 and the output Q of the flip-flop U8 being inverted (indicated by the symbol "o"at two of the inputs of the AND gate U10) before being logically combined to thus determine a RANGEBIT 0.

Table 1 shows possible combinations of overload conditions in association with the RANGEBIT 1 and the RANGEBIT 0. It is noted that the range bit outputs are definable based on the needs of a particular system.

TABLE 1

| High Range Over Load | Mid Range Over Load | Low Range Over Load | Range Bit 1 | Range Bit 0 |
|---|---|---|---|---|
| 0 | 0 | 0 | 0 | 0 |
| 0 | 0 | 1 | 0 | 1 |
| 0 | 1 | 0 | X | X |
| 0 | 1 | 1 | 1 | 0 |
| 1 | 0 | 0 | X | X |
| 1 | 0 | 1 | X | X |
| 1 | 1 | 0 | X | X |
| 1 | 1 | 1 | X | X |

Based on the states shown in Table 1, Equation 1 provides a logical expression for RANGEBIT 0 and Equation 2 provides a logical expression for RANGEBIT 1. Referring now to FIG. 6. the RANGE BIT 0, the Range Bit 1 and the data DOL, DOM and DOH output by the low, medium and high range overload detectors U1, U2 and U3, are provided to a multiplexer U12. The multiplexer U12 selects one of the data DOL, DOM and DOH according to the logical expressions of the Range Bits 1 and 0 and outputs the selected data at an output 0 of the multiplexer U13.

$$\overline{H}\ \overline{M}\ L = \text{Range Bit } 0 \qquad (1)$$

$$M\ L = \text{Range Bit } 1 \qquad (2)$$

where: $\overline{H}$ is the inverted output Q of the flip-flop U8;
  M is the output of Q of flip-flop U6;
  $\overline{M}$ is the inverted output Q of the flip-flop U6; and
  L is the output Q of the flip-flop U4

A multiplexer U13 selects between the output 0 of the multiplexer U12 and an arbitrary predefined overload value ALLOL according to whether the high range is overloaded. In a case where the high range is overloaded (and hence all lower ranges are overloaded), the output of the multiplexer U13 is driven to the arbitrary predefined overload value. The value of the ALLOL signal is determined by selecting a value which does not duplicate expected measured values. One circuit for generating an overload signal is shown In FIG. 7. In the ALLOL signal generator of FIG. 7, State 15 and the system clock SCK are used to generate the ALLOL signal.

In the multiplexer U13, the output 0 of the multiplexer 13 is controlled by the OLDHT signal, indicating that the highest range is overloaded. If the OLDHT signal indicates that the highest range is overloaded, it is presumed that all other ranges are also overloaded. However, depending on analog hardware (not shown) which provides inputs to the low, medium and high range AND converters 401, 403 and 404, respectively, a lower range may come out of saturation and settle before a higher range. For this case, the state table shown in Table 1 is modified to account for this condition. The corresponding circuit used to generate the range word would be modified accordingly. In such case, where the high range is overloaded, the ALLOL data word is output as the DATAOUT signal from an AND gate U14 as shown in FIG. 6. The most significant bit of the ALLOL data word is a 1 and the remaining bits are 0. The ALLOL data word is generated by the flip flop U24 shown in FIG. 7 and is recognized as an overload signal by a larger system (not shown) which incorporates the present invention. The AND gate U14 and an SR latch U15 shown in FIG. 6 are used to control a flow of data with the larger system (not shown). The SR latch U15 is set on State 16 and reset on State 31 of the state machine 441. During the time between the set and reset of the SR latch U15, the Q output of the SR latch U15 is high, allowing data from the multiplexer U13 to pass. Before State 16 and after State 32, the Q output of U15 low, preventing any data (except 0) from passing through the AND gate U14.

Alternatively, the measurement system of present invention may be implemented with discrete logic. Further, comparators are usable to determine an overload status of each measurement range. The comparators may have the analog monitor signal and a predetermined overload set point as inputs and the comparator outputs are used to determine an appropriate range of data to latch. Data from an overloaded range is delayed until the overloaded range has settled. The remainder of such a system is implemented as described above.

The measurement system according to the present invention has been described above as a three range measuring system. The number of ranges is readily extendable by adding additional overload detectors of the type shown as FIGS. 8A, 8B and 8C, adding additional inputs to logic gates U10 and U11 or adding additional logic gates similar to logic gates U10 and U11 and providing additional inputs for the multiplexer U12.

Figure 10:
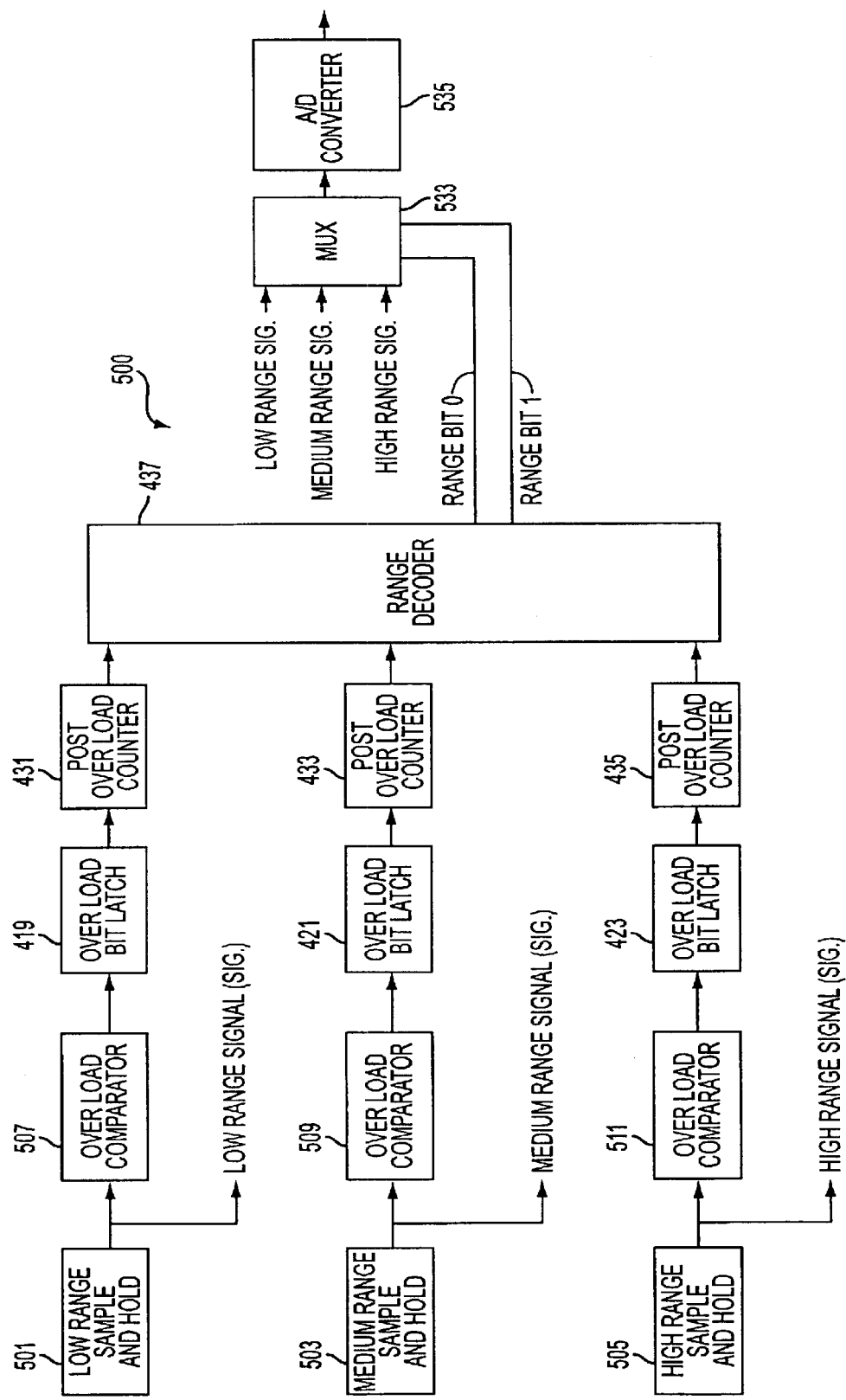
FIG. 10 is a block diagram of a third embodiment of a measurement system according to the present invention.

A third embodiment of the present invention is shown in FIG. 10. The third embodiment permits a larger portion of the system to be implemented in an analog domain. Referring now to FIG. 10, the third embodiment of a measurement system according to the present invention is illustrated as a three range measurement system 500. The measuring system 500 comprises: low, medium and high range sample and hold circuits 501, 503 and 505, respectively; low, medium and high range analog overload comparators 507, 509 and 511, respectively; low, medium and high range overload bit latches 419, 421 and 423, respectively; low, medium and high post overload counters 431, 433 and 435, respectively; a range decoder 437; an analog multiplexer (MUX) 533; and an analog to digital (A/D) converter 535.

For each of the low, medium and high measurement ranges, a corresponding analog transducer device (not shown) converts a physical parameter, such as for example, electrical current, electrical voltage, temperature, strain, pressure, etc., into an analog quantity. The low, medium and high range sample and hold circuits 501, 503 and 505, respectively, capture and hold a reading of the respective analog quantities. For each of the low, medium and high ranges, the analog overload comparators 507, 509 and 511 compare the respective sample and hold circuits 501, 503 and 505 with respective predetermined analog set points. If the analog value of a sample and hold value is greater that the corresponding set point, the output of the corresponding comparator will go high.

Overload bit latches 419, 421 and 423 respond to the outputs of the analog overload comparators 507, 509 and 511, respectively, in a similar manner as the response to the outputs of overload comparators 407, 409 and 411 described above with reference to FIG. 4 and a description of the response will not be repeated. Further, the post overload counters 431, 433 and 435 and range decoder 437 operate in a similar manner as described above with reference to FIG. 4 to generate the range word comprising the Range Bits 1 and 0.

The range decoder 437 decodes the overload status as indicated by the overload bit latches 419, 421 and 423 into the range word and the analog multiplexer 533 selects one of the outputs of the low, medium and high range sample and hold circuits according to the range bit logic as shown in Table 1. The A/D converter 535 converts the selected output of the multiplexer 533 to a digital output for use by the larger system (not shown).

Figure 11:
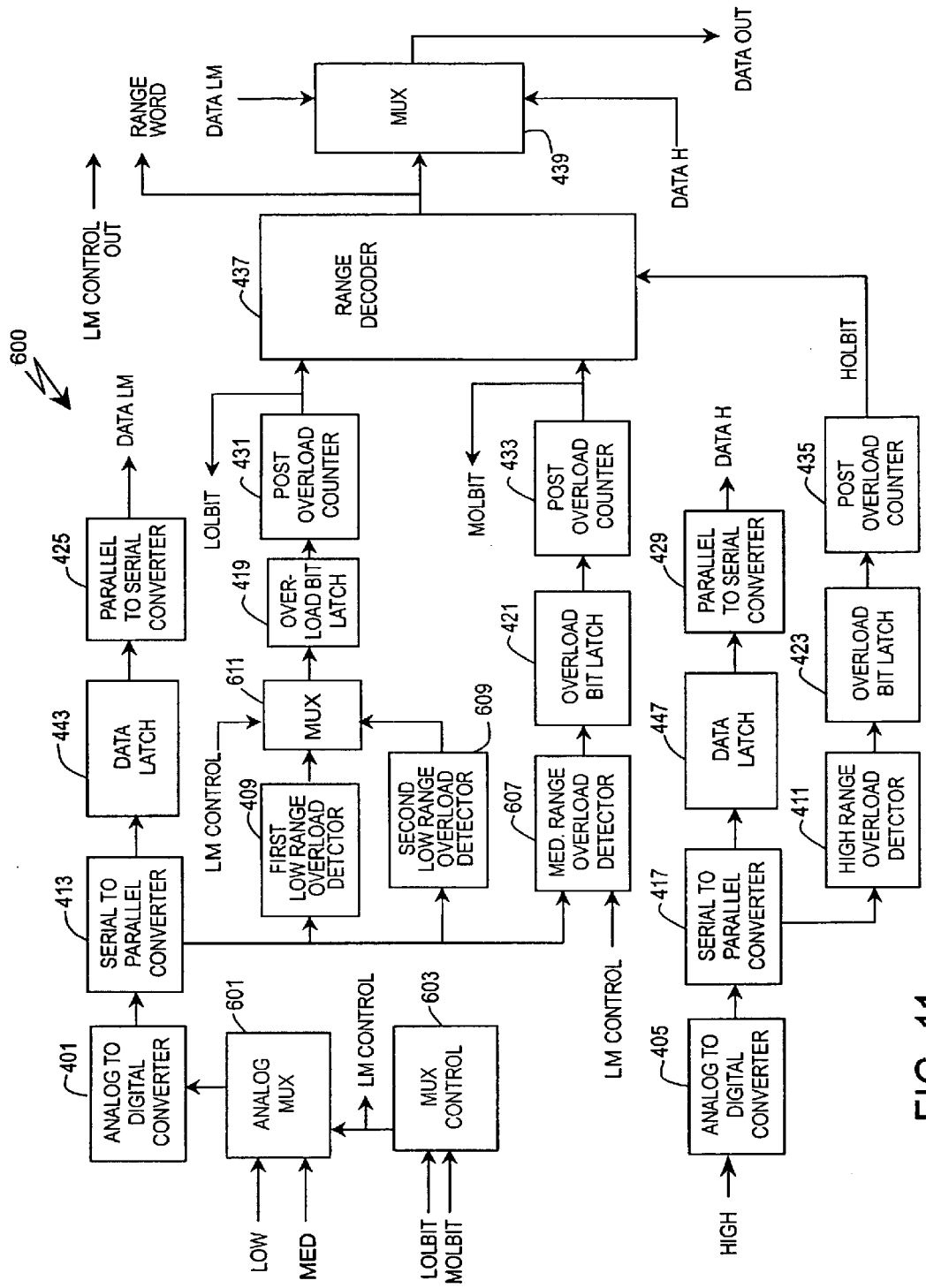
FIG. 11 is a block diagram of a fourth embodiment of a measuring system according to the present invention.

A fourth embodiment of the present invention is realizable as a measurement system comprising N ranges where N is greater than two. An example of the fourth embodiment of the present invention is referred to an N-range measuring system and is shown in FIG. 11. The N-range system is best suited where many measurement ranges are desired or required and where using individual analog to digital converters for each range is cost prohibitive. The N-range measurement system 600 comprises analog to digital converters 401 and 405; an analog multiplexer 601; a multiplexer controller 603; serial to parallel converters 413 and 417; data latches 443 and 447; parallel to serial converters 425 and 429; a first low range overload detector 409, a second low range overload detector 609; a medium range overload detector 607; a high range overload detector 411; overload bit latches 419, 421 and 423; post overload counters 431, 433 and 435; a range decoder 437; a multiplexer 611; and a data multiplexer 439.

The analog to digital converter 405 is used for an input of the highest measurement range and the analog converter 401 is shared among N−1 remaining analog inputs, shown as a low range (LOW) and a medium range (MED) in FIG. 11. In the embodiment shown, the low and medium ranges correspond to ranges 1 and 2, respectively. Although the example shown in FIG. 11 is a three-range implementation, the system shown in 600 is readily extendable to a greater number of ranges by applying the principles disclosed herein.

The measuring system 600 uses two analog to digital converters 401 and 405. The analog to digital converter 405 is used for the highest measurement range (Range N) and is always active, assuring that valid data is available within the specified range. The second converter is shared among the remaining analog inputs (Ranges 1 N−1).

The operations of the analog to digital converters 401 and 405, the serial to parallel converters 413 and 417, the data latches 443 and 447, the parallel to serial converters 425 and 429, the range decoder 437, the overload bit latches 419, 421 and 423, the post overload counters 431 and 433, and the data multiplexer 437 are the same as described with respect to the measurement system 400 shown in FIG. 4. In addition to using only one analog to digital converter 401 for the low and medium ranges (i.e., ranges 1 to N−1), the measurement system 600 differs from the measurement system 400 in that the medium range (Range 2) further comprises the second low range overload detector 609 which is operative where data is selected from the medium range transducer data to determine if the data represents an overload condition for the next lower range, in this case, the low range (Range 1).

Operation of the system 600 will be better appreciated by consideration of the following example of a sequence of events. Assume that the measurement system 600 is operating in the lowest measurement range, that is the LOW input is selected by the analog multiplexer 601. In this case the LOLBIT, MOLBIT, and HOLBIT are all low, that is, none of the overload bit latches 419, 421 and 423 is latched. Based on the range word, consisting of Range Bits 0 and 1 (see explanation regarding the range word in the description of FIG. 4), the range decoder 437 drives the multiplexer 439 to select the data DATALM. The LM CONTROL selects the LOW range input to the multiplexer 601 based on a combination of the LOLBIT and MOLBIT. Further, the LM CONTROL turns off the medium range overload detector 607 and sets the multiplexer 611 to pass data from the first low range overload detector 409. As the LOW signal increases in magnitude, the first low range overload detector 409 indicates on overload condition and the LOLBIT changes state, causing the range decoder 437 to switch to the HIGH range input for one sample while the multiplexer controller 603 changes the input to analog multiplexer 601 to the medium (MED) range. Simultaneously, the LM CONTROL activates the multiplexer 611 to accept an input from the second low overload detector 609 which at this point is operating using medium range data. The LM CONTROL also activates the medium range overload detector 607. The range decoder 437 will switch to the medium range on the next sample and remain there as long as the data input to the medium range in not overloaded and the second low overload detector 609 indicates that the MED input signal would overload the LOW range.

If the magnitude of the MED input increases and the medium range also saturates, the range decoder 437 will output a range word which causes the multiplexer 439 to select DATA. If the magnitude of the input signal to the medium range overload detector 607 falls, the medium range will come out of saturation and the post overload counter 433 will expire allowing the range decoder to output a range word selecting the DATA LM. The second low range overload detector 609 which operates from medium range data continues to monitor the data stream output by the serial to parallel converter 413. If the signal reaches a magnitude that does not represent an overload for the low range, the output of the second low range overload detector will change from an overload signal to a non-overload signal, allowing the low range post overload counter 431 to begin counting in the same manner as discussed with reference to FIG. 4. When the count expires, the multiplexer control 603 switches the multiplexer 601 to the LOW input.

The range word and the LM CONTROL are also output to a larger system which incorporates the present invention. Based on the range word and the LM CONTROL, the larger system logically determines whether the DATAOUT signal from the multiplexer 439 corresponds to the LOW, MED or HIGH ranges.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A system for measuring a physical quantity, comprising:
    a plurality of analog to digital converters, each of which synchronously samples and converts a respective analog of the physical quantity into a digital data stream, each digital data stream having a full scale output range corresponding to a predetermined fraction of a maximum expected value of the physical quantity;
    a plurality of overload detectors, each of which synchronously monitors a corresponding one of the data streams for a predetermined value which indicates an overload condition of the corresponding digital data stream and outputs a respective detection signal which indicates whether the overload condition exists for the corresponding data stream; and
    a data selector which selects and outputs the digital data stream having a smallest full scale output range for which an overload condition does not exist based on a logical combination of the respective detection signals.

2. The system of claim 1, wherein:
    each analog to digital converter outputs the corresponding data stream as a serial data stream;
    each overload detector:
        synchronously converts the corresponding serial data stream to a corresponding parallel data stream,
        monitors selected bits of the corresponding parallel data stream and latches an output if a value of the selected bits equals or exceeds the respective predetermined value, and
        synchronously reconstructs the corresponding parallel data stream to a serial data stream; and
    the data selector selects one of the reconstructed serial data streams based on a logical combination of the latched outputs.

3. The system of claim 2, wherein each overload detector further comprises:
    a post overload counter which holds the latched bit latched for a predetermined period of time after the value of the selected bits becomes less than the respective predetermined value.

4. The system of claim 3, wherein the post overload counter resets the hold of the latch bit if the value of the selected bits again exceeds the respective predetermined value during the predetermined period of time.

5. The system of claim 1, wherein each overload detector comprises:
    a shift register which converts the respective digital data stream to a corresponding parallel data stream; and
    a detection circuit which monitors selected bits of the respective parallel data stream and latches an output if a value of the selected bits equals or exceeds the respective predetermined value.

6. The system of claim 2, wherein the post overload counter counts from an initial value to a predetermined value to measure the predetermined period of time.

7. The system of claim 6, wherein the post overload counter restarts at the initial value if another overload condition is detected before expiration of the predetermined period of time.

8. The system of claim 5, wherein the detection circuit comprises:
    an AND gate which outputs a first logic signal if the digital value indicated by the selected bits is greater than or equal to a first reference value;
    a NAND gate which outputs a second logic signal if the digital value indicated by the selected bits is less than or equal to a second reference value;
    an OR gate which outputs one of the first and second logic signals; and
    a flip-flop which changes state to latch the output.

9. The system of claim 3, wherein the predetermined period of time is based on a settling time of the analog of the physical quantity.

10. A system for measuring a physical quantity, comprising:
    a first analog to digital converter which periodically samples a first analog of the physical quantity and converts the first samples to first digital words;
    a second analog to digital converter which periodically samples a second analog of the physical quantity and converts the second samples to second digital words;
    a first overload detector which detects whether a value of one of the first digital words indicates a first overload condition;
    a second overload detector which detects whether a value of one of the second digital words indicates a second overloaded condition, the first and second overload detectors synchronously detecting the respective overload conditions;
    a first circuit which latches a first output if the first overload condition is indicated;
    a second circuit which latches a second output if the second overload condition is indicated; and
    a data selector which:
        outputs a digital word corresponding to the one of the first digital words at a next sample time if the first and second circuits do not latch the first and second outputs, respectively, and
        outputs a digital word corresponding to the one of the second digital words at the next sample time if the first circuit latches the first output and the second circuit does not latch the second output.

11. The system of claim 10, wherein:
the data selector outputs another digital word if the first circuit latches the first output and the second circuit latches the second output.

12. The system of claim 11, wherein the another digital word corresponds to a predetermined arbitrary value.

13. The system of claim 11, wherein a sensitivity of the first analog is greater than a sensitivity of the second analog.

14. The system of claim 10, wherein:
each of the first and second overload detectors comprises a shift register which converts the respective digital word to respective parallel bits; and
each of the first and second circuits comprises a logic circuit which latches the respective output based on a digital value indicated by a respective predetermined number of the respective parallel bits.

15. The system of claim 10, wherein each of the first and second circuits releases the corresponding latch upon expiration of a respective predetermined period of time after the detected overload condition is cleared.

16. A method of measuring a physical quantity, comprising:
providing first and second digital words corresponding to a value of the physical quantity, the first digital word representing a greater sensitivity than a sensitivity of the second digital word;
simultaneously testing the first and second digital words to determine if a value of the first digital word differs from a first predetermined range and/or a value of the second digital word differs from a second predetermined range;
outputting data based on the first digital word if the value of the first digital word is within the predetermined range;
outputting data based on the second digital word if the value of the first digital word differs from the first predetermined range and the value of the second digital word is within the second predetermined range; and
outputting other data if the value of the first digital word differs from the value of the first predetermined range and the value of the second digital word differs from the second predetermined range.

17. The method of claim 16, wherein the other data is based on an arbitrary value.

18. The method of claim 16, wherein the simultaneous testing of the first and second digital words comprises:
comparing the first and second digital words to respective first and second predetermined upper limits and outputting a first result of the comparison; and
comparing the first and second digital words to respective first and second predetermined lower limits and outputting a second result of the comparison.

19. The method of claim 16, wherein the testing of the first digital words comprises:
selecting a predetermined number of bits of the first digital word;
determining that the first digital word is not within the predetermined range if all of the predetermined number of bits have a logical value of 1; and
determining that the first digital word is within the predetermined range if at least one of the predetermined number of bits has a logical value of 0 .

20. The method of claim 16, wherein the testing of the second digital word comprises:
selecting a predetermined number of bits of the second digital word;
determining that the second digital word is not within the predetermined range if all of the predetermined number of bits have a logical value of 1; and
determining that the second digital word is within the predetermined range if at least one of the predetermined number of bits has a logical value of 0.

21. A system for measuring a physical quantity, comprising:
a first overload detector which detects whether a value of a first digital word corresponding to a value of the physical quantity indicates a first overload condition;
a second overload detector which detects whether a value a second digital word corresponding to the value of the physical quantity indicates a second overload condition, the first digital word having a higher scale factor than the second digital word, the first and second overload detectors simultaneously detecting the respective overload conditions;
a first circuit which latches a first output if the first overload condition is indicated;
a second circuit which latches a second output if the second overload condition is indicated; and
a data selector which:
outputs a digital word corresponding to the first digital word at a next sample time if the first and second circuits do not latch the first and second outputs, respectively, and
outputs a digital word corresponding to the second digital word at the next sample time if the first circuit latches the first output and the second circuit does not latch the second output.

22. The system of claim 21, wherein the first circuit further comprises a post overload counter which holds the latch of the first output until expiration of a predetermined period of time after the detected first overload condition is cleared.

23. The system of claim 21, wherein the second circuit further comprises a post overload counter which holds the latch of the second output until expiration of a predetermined period of time after the detected second overload condition is cleared.

24. The system of claim 22, wherein the post overload counter counts from an initial value to a predetermined value to measure the predetermined period of time.

25. The system of claim 24, wherein the post overload counter restarts at the initial value if another overload condition is detected before expiration of the predetermined period of time.

26. The system of claim 23, wherein the post overload counter counts from an initial value to a predetermined value to measure the predetermined period of time.

27. The system of claim 26, wherein the post overload counter counts from an initial value to a predetermined value to measure the predetermined period of time.

28. The system of claim 22, further comprising:
a number of additional overload detectors each of which detects whether a value of a corresponding additional digital word corresponding to the value of the physical quantity indicates a respective additional overload condition, each additional digital word having a scale factor lower than the respective scale factors of the first and second digital words, each additional overload detector detecting a respective additional overload condition simultaneously with the detection of the first and second overload conditions, and a number of additional latch circuits corresponding to the number of additional overload detectors, each of the additional latch circuits latching a overload condition corresponding to the respective additional digital word; and wherein:

the data selector outputs a digital word corresponding to the digital word having the highest scale factor for which a corresponding latch circuit does not indicate an overload condition.

29. A system for measuring a physical quantity, comprising:
a plurality of analog to digital converters, each of which samples and synchronously converts an analog of the physical quantity into a digital data stream, each digital data stream having a full scale output range corresponding to a predetermined fraction a maximum expected value of the physical quantity;
a plurality of overload detectors, each of which synchronously monitors a respective one of the data streams for a respective predetermined value which represents an overload condition and outputs a detection signal which indicates whether the overload condition exists; and
a data selector which selects the digital data stream having a smallest full scale output range for which an overload condition does not exist based on a logical combination of the respective detection signals.

30. The system of claim 29, wherein:
the overload detectors determine whether the respective overload condition exists for each sample of each analog to digital converter; and
the data selector selects the digital data stream having the smallest full scale output range for which an overload condition does not exist on a sample by sample basis.

31. The system of claim 1, wherein:
the overload detectors determine whether the respective overload conditions exist for each sample of each analog to digital converter; and
the data selector selects the digital data stream having the smallest full scale output range for which an overload condition does not exist on a sample by sample basis.

32. A system for measuring a physical quantity, comprising:
a plurality of sample and hold circuits, each of which samples and holds an analog of the physical quantity, each sample and hold circuit having a full scale output range corresponding to a respective predetermined fraction of a maximum expected value of the physical quantity;
a plurality of overload comparators, each of which monitors an output of a respective one of the sample and hold circuits for an overload condition and outputs a detection signal which indicates whether the overload condition exists; and
a data selector which selects the output of the sample and hold circuit having a smallest full scale output range for which an overload condition does not exist based on a logical combination of the respective detection signals.

33. The system of claim 32, further comprising a plurality of latches, each latch latching an output of a respective overload comparator if the comparator indicates the overload condition.

34. The system of claim 33, further comprising a post overload counter which holds the latched output latched for a predetermined period of time after the overload condition is removed.

35. The system of claim 34, wherein the post overload counter resets the hold of the latched output if the overload condition is again indicated prior to expiration of the predetermined period of time.

36. A system for measuring a physical quantity, comprising:
a first analog to digital converter which converts an analog of the physical quantity into a first digital data stream, the first digital data stream having a first full scale output range corresponding to a maximum expected value of the physical quantity;
a first multiplexer which selects one of a plurality of other analogs of the physical quantity, each of the other analogs having a full scale output range of a respective predetermined fraction of the maximum expected value of the physical quantity;
a second analog to digital converter which converts the selected analog into a second digital data stream, the second digital data stream having a second full scale output range corresponding to the full scale output range of the selected analog;
a second multiplexer which outputs the second digital data stream where the second digital data stream is not saturated and outputs the first digital data stream where the second digital data stream is saturated.

37. The system of claim 36, further comprising:
a first and second overload detectors which detect whether the second digital data stream is overloaded and output respective first and second overload detection signals;
a third multiplexer which selects one of the first and second overload detection signals in response to a control;
a third overload detector which detects whether the second digital data stream is overloaded and outputs a third detection signal if the third overload detector is enabled by the control;
a fourth overload detector which detects whether the first digital data stream is overloaded and outputs a fourth detection signal; and
a multiplexer control which outputs the control based on the selected overload detection signal and the third overload detection signal.

38. The system of claim 37, wherein the multiplexer control further controls the first multiplexer.

39. The system of claim 37, further comprising:

a latch which latches the selected detection signal if the selected detection signal indicates an overload condition; and a post overload counter which holds the latch latched for a predetermined time after the selected detection signal ceases to indicate an overload condition.

40. The system of claim 39 further comprising:

a second latch which latches the third detection signal if the third detection signal indicates an overload condition; and a second post overload counter which holds the second latch latched for a predetermined period of time after the third detection signal ceases to indicate an overload condition.

41. The system of claim 40, further comprising:

a third latch which latches the third detection signal if the third detection signal indicates an overload condition; and a third post overload counter which holds the second latch latched for a predetermined period of time after the third detection signal ceases to indicate an overload condition.

42. The system of claim 41, wherein the multiplexer control outputs the control based on the latched selected overload detection signal, the latched third overload detection signal and the latched fourth overload detection signal.

* * * * *